(12) United States Patent
Maxim et al.

(10) Patent No.: US 10,205,425 B2
(45) Date of Patent: Feb. 12, 2019

(54) VARIABLE GAIN LOW NOISE AMPLIFIER

(71) Applicant: Qorvo US, Inc., Greensboro, NC (US)

(72) Inventors: George Maxim, Saratoga, CA (US); Marcus Granger-Jones, Scotts Valley, CA (US); Kelvin Kai Tuan Yan, Oak Ridge, NC (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/607,935

(22) Filed: May 30, 2017

(65) Prior Publication Data

US 2017/0346448 A1   Nov. 30, 2017

Related U.S. Application Data

(60) Provisional application No. 62/342,637, filed on May 27, 2016.

(51) Int. Cl.
| | |
|---|---|
| *H03F 1/26* | (2006.01) |
| *H03G 1/00* | (2006.01) |
| *H03F 3/21* | (2006.01) |
| *H03F 1/32* | (2006.01) |
| *H03F 3/72* | (2006.01) |

(Continued)

(52) U.S. Cl.
CPC ............... *H03F 1/26* (2013.01); *H03F 1/32* (2013.01); *H03F 1/3211* (2013.01); *H03F 3/211* (2013.01); *H03F 3/72* (2013.01); *H03G 1/0023* (2013.01); *H03G 1/0088* (2013.01); *H03F 1/0288* (2013.01); *H03F 3/602* (2013.01); *H03F 2200/294* (2013.01); *H03F 2203/21109* (2013.01); *H03F 2203/7236* (2013.01)

(58) Field of Classification Search
CPC .......... H03F 1/26; H03F 1/3211; H03F 3/211; H03F 1/0288; H03F 1/07; H03F 3/60; H03F 3/602; H03F 3/605; H03F 3/607; H03G 1/0023; H03G 1/0035; H03G 1/0088; H03G 3/24; H03G 3/301
USPC ..................... 330/254, 286, 124 R, 295, 302
See application file for complete search history.

(56) References Cited

U.S. PATENT DOCUMENTS

| | | | | |
|---|---|---|---|---|
| 5,548,246 | A * | 8/1996 | Yamamoto | ............ H03F 1/0277 330/302 |
| 6,933,779 | B2 * | 8/2005 | Lee | ........................ H03F 3/72 330/51 |

(Continued)

*Primary Examiner* — Khanh V Nguyen
(74) *Attorney, Agent, or Firm* — Withrow & Terranova, P.L.L.C.

(57) ABSTRACT

LNA circuitry includes an input node, and output node, a primary amplifier stage, a first ancillary amplifier stage, and an input gain selection switch. The primary amplifier stage is configured to provide a first gain response between a primary amplifier stage input node and a primary amplifier stage output node, wherein the primary amplifier stage input node is coupled to the input node and the primary amplifier stage output node is coupled to the output node. The first ancillary amplifier stage is configured to provide a second gain response between a first ancillary amplifier stage input node and a first ancillary amplifier stage output node, wherein the first ancillary amplifier stage output node is coupled to the primary amplifier stage output node. The input gain selection switch is coupled between the input node and the first ancillary amplifier stage input node.

20 Claims, 4 Drawing Sheets

(51) Int. Cl.
*H03F 1/02* (2006.01)
*H03F 3/60* (2006.01)

(56) References Cited

U.S. PATENT DOCUMENTS 8,884,692 B2 * 11/2014 Lee ........................ H03F 3/72
　　　　　　　　　　　　　　　　　　330/51
9,698,731 B2 * 7/2017 Ge ........................ H03F 1/0288

\* cited by examiner

VARIABLE GAIN LOW NOISE AMPLIFIER

RELATED APPLICATIONS

This application claims the benefit of provisional patent application Ser. No. 62/342,637, filed May 27, 2016, the disclosure of which is hereby incorporated herein by reference in its entirety.

FIELD OF THE DISCLOSURE

The present disclosure relates to low noise amplifiers (LNAs), and specifically to variable gain LNAs with multiple active gain stages to provide different gain levels with high performance.

BACKGROUND

Figure 1:
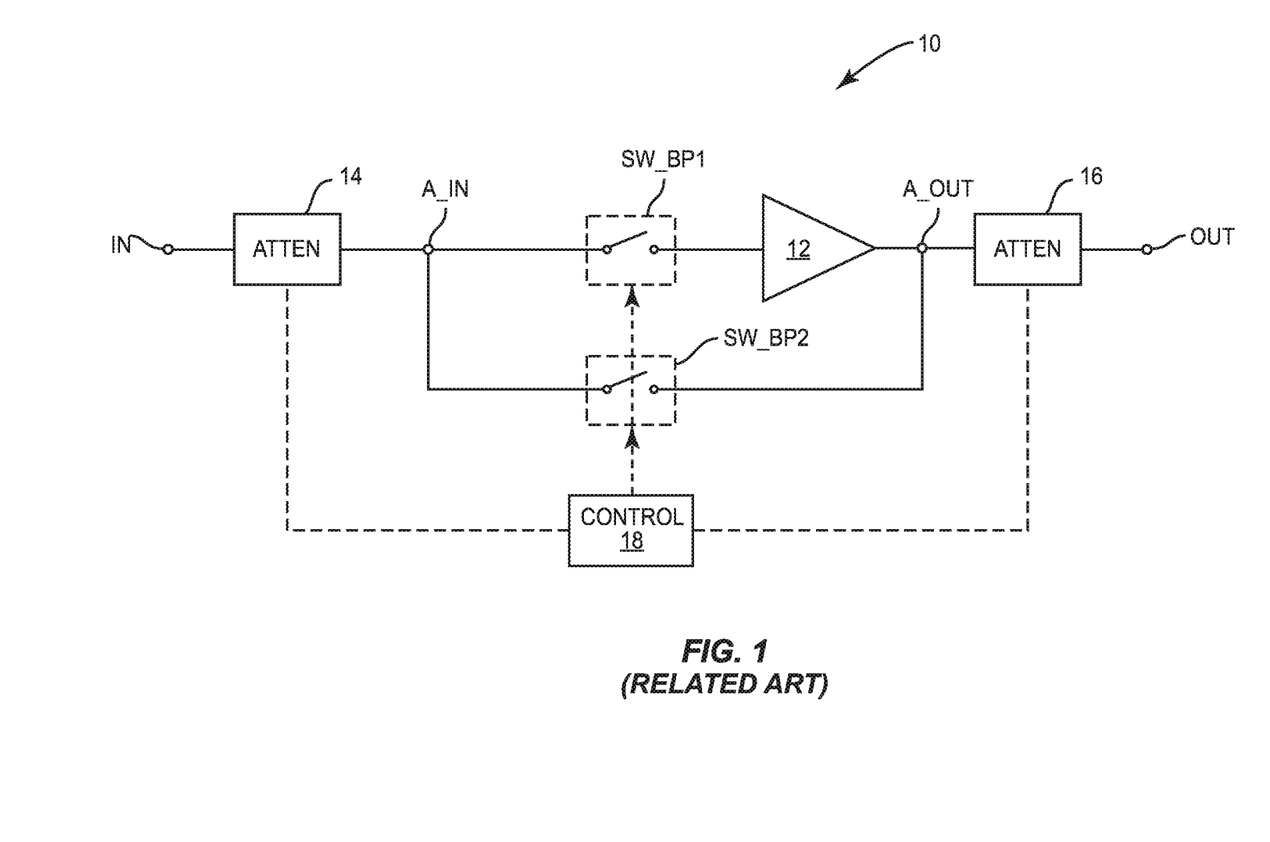
FIG. 1 is a functional schematic illustrating conventional variable gain low noise amplifier (LNA) circuitry.

Low noise amplifiers (LNAs) are used throughout wireless communications devices. One prominent use for LNAs is in the amplification of radio frequency (RF) receive signals so that these signals can be properly processed by downstream circuitry in a wireless communications device. Because a single LNA may amplify RF receive signals within different RF frequency bands, each of which may require a different amount of amplification so that they may be properly processed, there is often a desire for variable gain LNAs capable of providing multiple gain responses. FIG. 1 shows exemplary conventional LNA circuitry 10 capable of providing multiple gain responses.

The conventional LNA circuitry 10 includes an input node IN, an output node OUT, an amplifier 12, an input attenuator 14, an output attenuator 16, a first bypass switch SW_BP1, a second bypass switch SW_BP2, and control circuitry 18. The amplifier 12 is configured to provide a gain response between an amplifier input node A_IN and an amplifier output node A_OUT. Generally, this gain response provides the maximum desired gain of the conventional LNA circuitry 10. The input attenuator 14 is coupled between the input node IN and the amplifier input node A_IN and configured to provide a desired amount of attenuation between the input node IN and the amplifier input node A_IN in order to change a gain response of the conventional LNA circuitry 10. The output attenuator 16 is coupled between the amplifier output node A_OUT and the output node OUT and similarly configured to provide a desired amount of attenuation between the amplifier output node A_OUT and the output node OUT in order to change a gain response of the conventional LNA circuitry 10. The first bypass switch SW_BP1 is coupled between the amplifier input node A_IN and the amplifier 12, and the second bypass switch SW_BP2 is coupled in parallel with the amplifier 12 between the amplifier input node A_IN and the amplifier output node A_OUT. Together, the first bypass switch SW_BP1 and the second bypass switch SW_BP2 are configured to bypass the amplifier 12 when a zero gain response (i.e., 0 decibel (dB) gain response) or a negative gain response (i.e., negative dB gain response) is desired from the conventional LNA circuitry 10. The control circuitry 18 is configured to provide control signals to each one of the input attenuator 14, the output attenuator 16, and the bypass switch SW_BP in order to provide a desired gain response between the input node IN and the output node OUT of the conventional LNA circuitry 10. For example, to provide a first gain response, which is the maximum gain response, the input attenuator 14 and the output attenuator 16 are controlled to directly pass signals (with no attenuation), the first bypass switch SW_BP1 is closed, and the second bypass switch SW_BP2 is open. Accordingly, the amplifier 12 is placed in the signal path of the conventional LNA circuitry 10 and provides the maximum gain response. To provide a second gain response, which is the minimum gain response, the input attenuator 14 and the output attenuator 16 are controlled to provide a maximum level of attenuation, the first bypass switch SW_BP1 is opened to remove the input capacitance thereof from the signal path of the conventional LNA circuitry 10, and the second bypass switch SW_BP2 is closed to bypass the amplifier 12. Accordingly, the amplifier 12 is removed from the signal path of the conventional LNA circuitry 10 and the minimum gain response is provided.

The first bypass switch SW_BP1 provides some insertion loss (e.g., 0.1 dB to 0.4 dB, depending on the frequency of operation thereof) that directly contributes to an overall noise figure of the LNA circuitry 10, thereby setting a floor for the noise level thereof. Further, due to the fact that the first bypass switch SW_BP1 is located in the main signal path of the amplifier 12, the linearity of the conventional LNA circuitry 10 is reduced when providing the first gain response (i.e., the maximum gain response). This is due to inherent non-linearity associated with switching elements. While the linearity of the switch may be improved, such a high performance switching element will add significant cost to the circuitry, and the effect of the first bypass switch SW_BP1 cannot be eliminated altogether. Further, using the input attenuator 14 and the output attenuator 16 to reduce the gain of the conventional LNA circuitry 10 over a large range is generally inefficient, as the power used by the conventional LNA circuitry 10 does not reduce in proportion to the gain provided thereby. This is because the gain response of the amplifier 12 does not change, but rather is altered using the input attenuator 14 and the output attenuator 16 to produce a desired gain. The power consumption of the conventional LNA circuitry 10 is thus the same at any gain level.

Accordingly, there is a need for LNA circuitry that is capable of providing a variable gain response without degrading the performance thereof.

SUMMARY

The present disclosure relates to low noise amplifiers (LNAs), and specifically to variable gain LNAs with multiple active gain stages to provide different gain levels with high performance. In one embodiment, LNA circuitry includes an input node, and output node, a primary amplifier stage, a first ancillary amplifier stage, and an input gain selection switch. The primary amplifier stage is configured to provide a first gain response between a primary amplifier stage input node and a primary amplifier stage output node, wherein the primary amplifier stage input node is coupled to the input node and the primary amplifier stage output node is coupled to the output node. The first ancillary amplifier stage is configured to provide a second gain response between a first ancillary amplifier stage input node and a first ancillary amplifier stage output node, wherein the first ancillary amplifier stage output node is coupled to the primary amplifier stage output node. The input gain selection switch is coupled between the input node and the first ancillary amplifier stage input node. The LNA circuitry is configured to operate in a first mode in which the primary amplifier stage is active, the first ancillary amplifier stage is inactive, and the input gain selection switch is opened such that the first gain response is provided between the input node and the output node. The LNA circuitry is further configured to operate in a second mode in which the primary amplifier stage is inactive, the first ancillary amplifier stage is active, and the input gain selection switch is closed such that the second gain response is provided between the input node and the output node. By providing the primary amplifier stage and the first ancillary amplifier stage and operating them as described above, the LNA circuitry may provide multiple gain responses. Since each one of the amplifier stages in the LNA circuitry can be optimized for gain, linearity, or any other performance characteristic as desired, the performance of the LNA circuitry may be superior to conventional solutions for many different gain responses.

In one embodiment, primary matching circuitry is coupled between the input node and the primary amplifier stage input node, and ancillary matching circuitry is coupled between the input gain selection switch and the first ancillary amplifier stage input node. The primary matching circuitry and the ancillary matching circuitry are configured to maintain an impedance presented at the input node at a substantially constant value. Accordingly, phase distortion due to changing the gain response of the LNA circuitry may be avoided, thereby improving the performance of the LNA circuitry.

In one embodiment, a second ancillary amplifier stage is configured to provide a third gain response between a second ancillary amplifier stage input node and a second ancillary amplifier stage output node, wherein the second ancillary amplifier stage input node is coupled to the first ancillary amplifier stage input node and the second ancillary amplifier stage output node is coupled to the first ancillary amplifier stage output node. In the first mode and the second mode of the LNA circuitry, the second ancillary amplifier stage is inactive. The LNA circuitry is further configured to operate in a third mode in which the primary amplifier stage and the first ancillary amplifier stage are inactive, the second ancillary amplifier stage is active, the input gain selection switch is closed, and the output gain selection switch is closed such that the third gain response is provided between the input node and the output node.

In one embodiment, an output gain selection switch is coupled between the first ancillary amplifier stage output node and the output node. The output gain selection switch may be opened in the first mode of the LNA circuitry, and closed in the second and third modes of the LNA circuitry.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
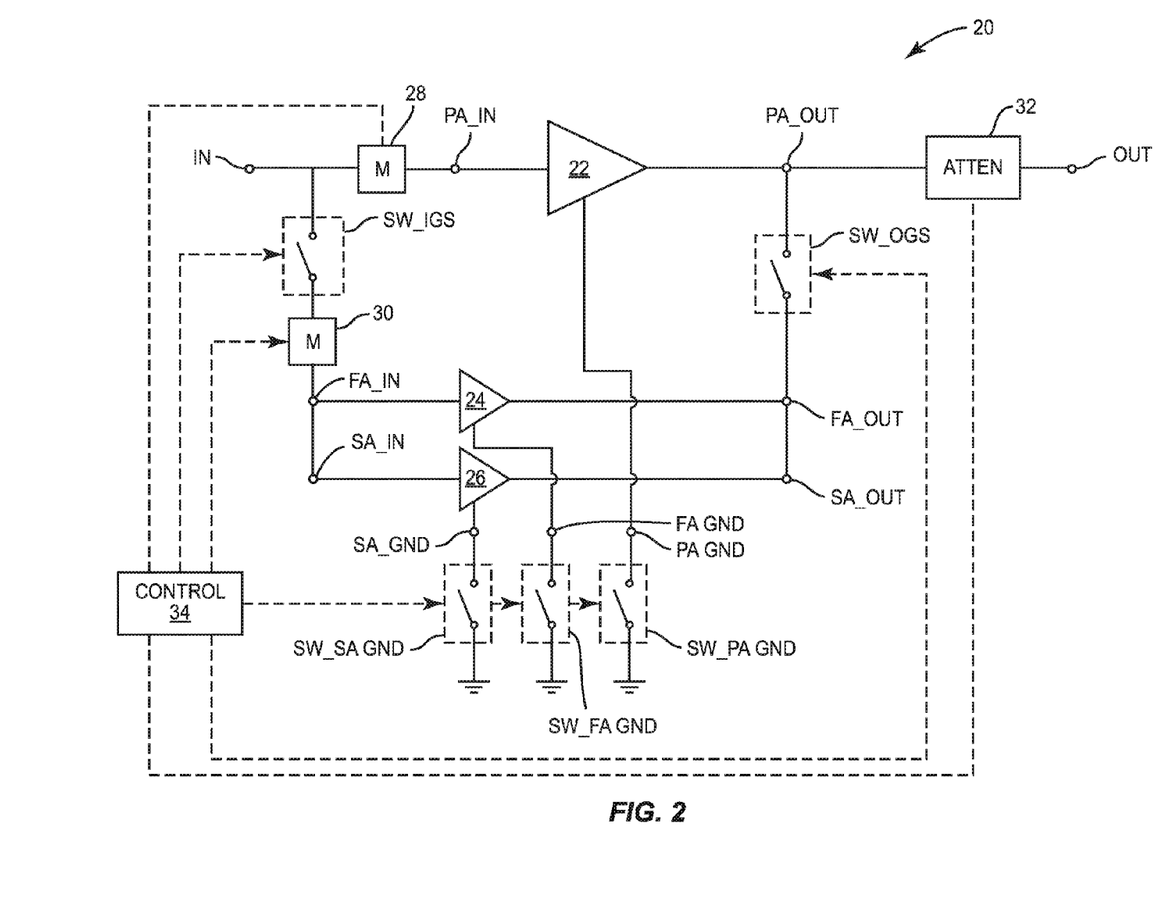
FIG. 2 is a functional schematic illustrating variable gain LNA circuitry according to one embodiment of the present disclosure.

FIG. 2 shows low noise amplifier (LNA) circuitry 20 according to one embodiment of the present disclosure. The LNA circuitry 20 includes an input node IN, an output node OUT, a primary amplifier stage 22, a first ancillary amplifier stage 24, and a second ancillary amplifier stage 26. The primary amplifier stage 22 is configured to provide a first gain response between a primary amplifier stage input node PA_IN and a primary amplifier output node PA_OUT. The first ancillary amplifier stage 24 is configured to provide a second gain response between a first ancillary amplifier stage input node FA_IN and a first ancillary amplifier stage output node FA_OUT. The second ancillary amplifier stage 26 is configured to provide a third gain response between a second ancillary amplifier stage input node SA_IN and a second ancillary amplifier stage output node SA_OUT.

The input node IN is coupled to the primary amplifier stage input node PA_IN via primary matching circuitry 28. Further, the input node IN is coupled to the first ancillary amplifier stage input node FA_IN via an input gain selection switch SW_IGS and ancillary matching circuitry 30, which are coupled in series as shown. The second ancillary amplifier stage input node SA_IN is coupled to the first ancillary amplifier stage input node FA_IN. The primary amplifier stage output node PA_OUT is coupled to the output node OUT via attenuator circuitry 32, which may be adjustable attenuator circuitry. The primary amplifier stage output node PA_OUT is coupled to the first ancillary amplifier stage output node FA_OUT via an output gain selection switch SW_OGS. The second ancillary amplifier stage output node SA_OUT is coupled to the first ancillary amplifier stage output node FA_OUT. Notably, the primary matching circuitry 28, the ancillary matching circuitry 30, the input gain selection switch SW_IGS, the output gain selection switch SW_OGS, and the attenuator circuitry 32 are all optional and all or any portion thereof may be omitted without departing from the principles of the present disclosure.

The primary amplifier stage 22 may include a primary amplifier stage grounding node PA_GND, which must be coupled to ground to activate the primary amplifier stage 22. As will be appreciated by those skilled in the art, the primary amplifier stage 22 may be a cascode transistor pair, which must be grounded so that the transistor pair is not left floating. In order to selectively activate the primary amplifier stage 22, a primary amplifier stage grounding switch SW_PAGND is provided between the primary amplifier grounding node PA_GND and a ground.

The first ancillary amplifier stage 24 may include a first ancillary amplifier stage grounding node FA_GND, which must be coupled to ground to activate the first ancillary amplifier stage 24. In order to selectively activate the first ancillary amplifier stage 24, a first ancillary amplifier stage grounding switch SW_FAGND is provided between the first ancillary amplifier stage grounding node FA_GND and a ground. The second ancillary amplifier stage 26 may include a second ancillary amplifier stage grounding node SA_GND, which must be coupled to ground to activate the second ancillary amplifier stage 26. In order to selectively activate the second ancillary amplifier stage, a second ancillary amplifier stage grounding switch SW_SAGND is provided between the second ancillary amplifier stage grounding node SA_GND and a ground.

Notably, different ways of activating and deactivating the primary amplifier stage 22, the first ancillary amplifier stage 24, and the second ancillary amplifier stage 26 exist, such as by altering a bias voltage provided thereto, by cascode device bias enabling, or by any other methods that will be appreciated by those skilled in the art, all of which are contemplated herein.

While the above discussion is focused on selectively coupling a grounding node of an amplifier stage to a ground in order to activate and deactivate the amplifier stage, those skilled in the art will appreciate that there may be several different ways for activating and inactivating amplifier stages, all of which are contemplated herein.

Control circuitry 34 is coupled to the primary matching circuitry 28, the ancillary matching circuitry 30, the input gain selection switch SW_IGS, the output gain selection switch SW_OGS, the attenuator circuitry 32, the primary amplifier stage grounding switch SW_PAGND, the first ancillary amplifier stage grounding switch SW_FAGND, and the second ancillary amplifier stage grounding switch SW_SAGND in order to control these components as discussed below.

The primary matching circuitry 28 and the ancillary matching circuitry 30 may be configured to maintain an impedance presented at the input node IN at a substantially constant value, even as the gain response of the LNA circuitry 20 is adjusted, for example, by activating and deactivating one or more of the primary amplifier stage 22, the first ancillary amplifier stage 24, and the second ancillary amplifier stage 26. This may be important in order to avoid phase distortion that may otherwise occur due to changing input impedance as the gain response of the LNA circuitry 20 changes. Specifically, by activating and deactivating the primary amplifier stage 22, the first ancillary amplifier stage 24, and the second ancillary amplifier stage 26 and providing them in the signal path of the LNA circuitry 20, the capacitance presented to the input node IN will change due to the different input capacitance of each of these devices. Accordingly, the primary matching circuitry 28 and the ancillary matching circuitry 30 may include one or more adjustable impedance components such as adjustable capacitors (e.g., digital programmable capacitor arrays, varactors, and the like), adjustable inductors, and the like. The impedance of these components may be adjusted as a gain response of the LNA circuitry 20 is adjusted in order to maintain the impedance presented to the input node IN at a substantially constant value. Those skilled in the art will appreciate that there are many different configurations for the primary matching circuitry 28 and the ancillary matching circuitry 30, all of which are contemplated herein.

As discussed above, the primary amplifier stage 22, the first ancillary amplifier stage 24, and the second ancillary amplifier stage 26 may be cascode transistor pairs. However, the present disclosure is not so limited. The primary amplifier stage 22, the first ancillary amplifier stage 24, and the second ancillary amplifier stage 26 may be any type of suitable amplifier topology.

In operation, the LNA circuitry 20 is configured to operate in multiple modes in order to provide different gain responses. In a first mode, the primary amplifier stage 22 is active while the first ancillary amplifier stage 24 and the second ancillary amplifier stage 26 are inactive. Accordingly, the primary amplifier stage grounding switch SW_PAGND may be closed while the first ancillary amplifier stage grounding switch SW_FAGND and the second ancillary amplifier stage grounding switch SW_SAGND are open. Further, the input gain selection switch SW_IGS and the output gain selection switch SW_OGS are open. Accordingly, the primary amplifier stage 22 provides the first gain response in the signal path of the LNA circuitry 20. The attenuator circuitry 32 may alter the first gain response as desired (e.g., by adding attenuation to reduce the gain response). However, as discussed above, it may be inefficient to use attenuation circuitry to significantly reduce a gain response of an amplifier stage, and thus the first ancillary amplifier stage 24 and the second ancillary amplifier stage 26 are provided and operated as discussed below.

In a second mode, the primary amplifier stage 22 and the second ancillary amplifier stage 26 are inactive while the first ancillary amplifier stage 24 is active. Accordingly, the primary amplifier stage grounding switch SW_PAGND and the second ancillary amplifier stage grounding switch SW_SAGND may be open while the first ancillary amplifier stage grounding switch SW_FAGND may be open. Further, the input gain selection switch SW_IGS and the output gain selection switch SW_OGS may be closed. Accordingly, the first ancillary amplifier stage 24 provides the second gain response in the signal path of the LNA circuitry 20. The attenuator circuitry 32 may alter the second gain response as desired (e.g., by adding attenuation to reduce the gain response).

In a third mode, the primary amplifier stage 22 and the first ancillary amplifier stage 24 are inactive while the second ancillary amplifier stage 26 is active. Accordingly, the primary amplifier stage grounding switch SW_PAGND and the first ancillary amplifier stage grounding switch SW_FAGND may be open while the second ancillary amplifier grounding switch SW_SAGND is closed. Further, the input gain selection switch SW_IGS and the output gain selection switch SW_OGS may be closed. Accordingly, the second ancillary amplifier stage 26 may provide the third gain response in the signal path of the LNA circuitry 20. The attenuator circuitry 32 may alter the second gain response as desired (e.g., by adding attenuation to reduce the gain response).

In a fourth mode, the primary amplifier stage 22 is inactive while the first ancillary amplifier stage 24 and the second ancillary amplifier stage 26 are active. Accordingly, the primary amplifier stage grounding switch SW_PAGND may be open while the first ancillary amplifier grounding switch SW_FAGND and the second ancillary amplifier grounding switch SW_SAGND are closed. Further, the input gain selection switch SW_IGS and the output gain selection switch SW_OGS may be closed. Accordingly, the first ancillary amplifier stage 24 and the second ancillary amplifier stage 26 provide the second gain response and the third gain response, respectively, in the signal path of the LNA circuitry 20 such that a combined fourth gain response is provided. The attenuator circuitry 32 may alter the fourth gain response as desired (e.g., by adding attenuation to reduce the gain response).

The primary amplifier stage 22 may provide a maximum gain response of the LNA circuitry 20, and thus may be the largest sized amplifier stage in the LNA circuitry 20. The first ancillary amplifier stage 24 and the second ancillary amplifier stage 26 may provide significantly less gain than the primary amplifier stage 22 and thus may be much smaller than the primary amplifier stage 22. Those skilled in the art will appreciate that the first ancillary amplifier stage 24 and the second ancillary amplifier stage 26 may be "micro" amplifier stages.

The first gain response may be larger than the second gain response, which is in turn larger than the third gain response. In one embodiment, the first gain response may be a "G0" gain response between +14 dB and +16 dB. Specifically, the first gain response may be +15 dB. The attenuator circuitry 32 may reduce the first gain response down to a level just above the second gain response in various embodiments such that a gain between a level just above the second gain response and the first gain response may be achieved by the LNA circuitry 20 when the primary amplifier stage 22 is active. The second gain response may be a "G3" gain response between +6 dB and +8 dB. Specifically, the second gain response may be +7 dB. The attenuator circuitry 32 may reduce the second gain response down to a level just above the third gain response in various embodiments such that a gain between a level just above the third gain response and the second gain response may be achieved by the LNA circuitry 20 when the first ancillary amplifier stage 24 is active. The third gain response may be a "G5" gain response between −3.5 dB and −5.5 dB. Specifically, the third gain response may be −4.5 dB. The attenuator circuitry 32 may reduce the third gain response down to a desired level, such that a range of gain values may be achieved when the second ancillary amplifier stage 26 is active.

In addition to selectively switching in and out the primary amplifier stage 22, the first ancillary amplifier stage 24, and the second ancillary amplifier stage 26, different gain levels may also be achieved by altering a bias provided to each one of the primary amplifier stage 22, the first ancillary amplifier stage 24, and the second ancillary amplifier stage 26. Further, other performance parameters such as noise, linearity, and the like may also be adjusted in this manner.

By providing the LNA circuitry 20 as shown in FIG. 2 and operating it as discussed herein, the LNA circuitry 20 may provide several different gain responses without sacrificing linearity or efficiency for several reasons. First, there are no switching elements in the signal path of the LNA circuitry 20 when the primary amplifier stage 22 is active. As discussed above, switching elements generally provide an inherent degree of non-linearity, which may be problematic in high gain modes due to the fact that such non-linearities may be amplified and thus significantly affect signal quality. Further, switching elements generally provide a certain insertion loss that directly affects the performance of the LNA circuitry 20, particularly at high frequencies. Accordingly, designing the LNA circuitry 20 such that there are no switching elements in the signal path in high gain modes (e.g., the first gain mode) results in a decrease in noise and an increase in the linearity of the LNA circuitry 20 in the first mode wherein a maximum gain response is provided. Second, each one of the primary amplifier stage 22, the first ancillary amplifier stage 24, and the second ancillary amplifier stage 26 may be optimized to provide their respective gain responses. As discussed above, conventional approaches use only a single amplifier. This single amplifier always provides the same gain response, which is then adjusted as desired by external circuitry such as an attenuator. Accordingly, the power dissipation of conventional LNA circuitry does not change in proportion to a gain response thereof. In contrast, providing multiple amplifier stages allows each stage to be optimized for the gain response that it provides, meaning that each amplifier stage need only consume the power required to provide the gain response thereof. By activating and deactivating these amplifier stages, the power consumption of the LNA circuitry 20 scales with gain, thereby increasing efficiency.

Figure 3:
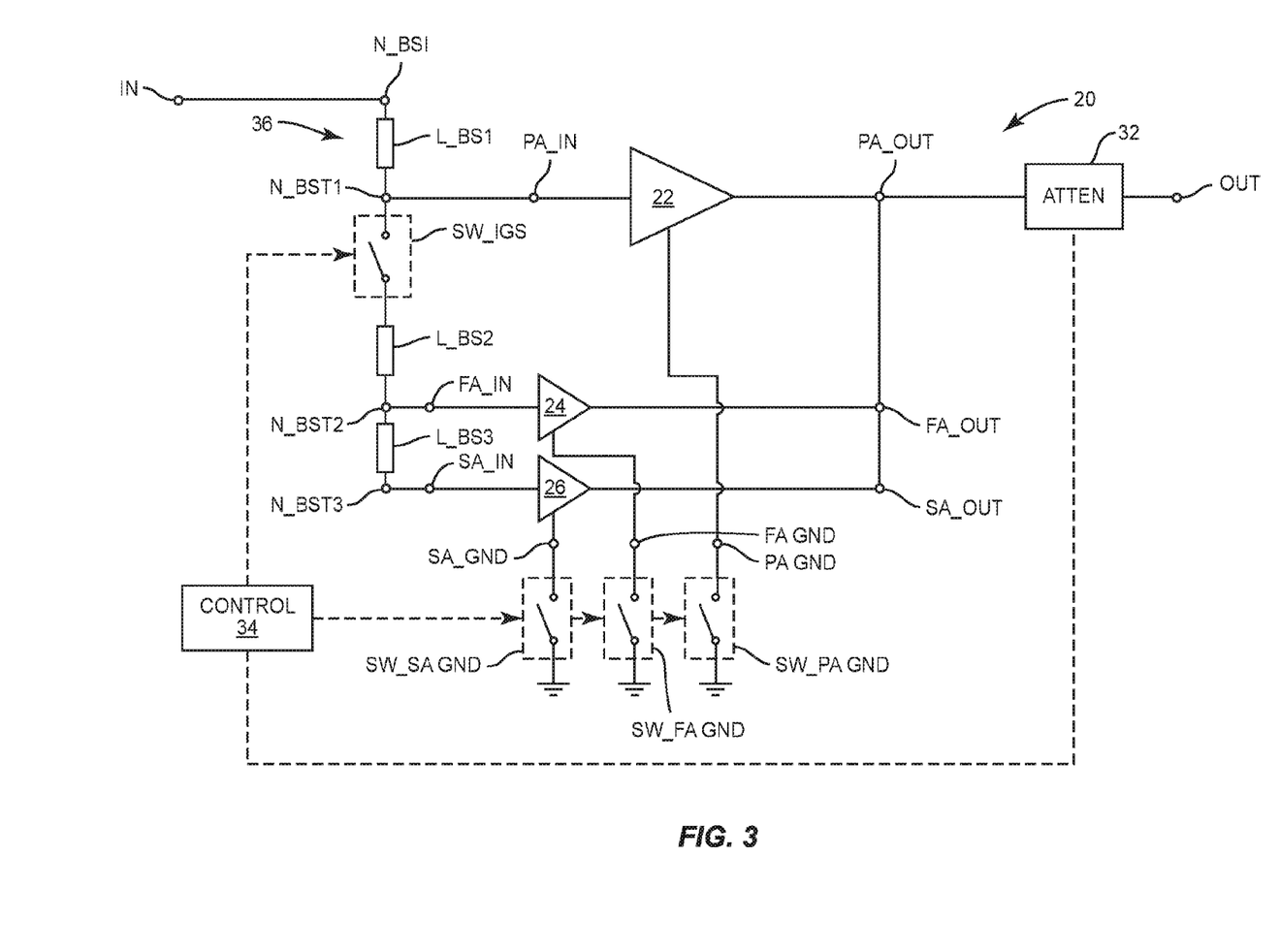
FIG. 3 is a functional schematic illustrating variable gain LNA circuitry according to one embodiment of the present disclosure.

FIG. 3 shows the LNA circuitry 20 according to an additional embodiment of the present disclosure. The LNA circuitry 20 shown in FIG. 3 is substantially similar to that shown in FIG. 2, but further includes a multi-tap bias selection inductor 36 including a first bias selection inductor section L_BS1, a second bias selection inductor section L_BS2, and a third bias selection inductor section L_BS3. The first bias selection inductor section L_BS1 is coupled between a bias selection inductor input node N_BSI and a first bias selection inductor tap node N_BST1. The second bias selection inductor section L_BS2 is coupled between the first bias selection inductor tap node N_BST1 and a second bias selection inductor tap node N_BST2. The third bias selection inductor section L_BS3 is coupled between the second bias selection inductor tap node N_BST2 and a third bias selection inductor tap node N_BST3. The first bias selection inductor tap node N_BST1 is coupled to the primary amplifier section input node PA_IN. The second bias selection inductor tap node N_BST2 is coupled to the first amplifier section input node FA_IN. The third bias selection inductor tap node N_BST3 is coupled to the second amplifier section input node SA_IN. The input bias selection switch SW_IB may be coupled between the first bias selection inductor tap node N_BST1 and the second bias selection inductor section L_BS2 if it is provided. However, as discussed above, the input bias selection switch SW_IB may or may not be provided in various embodiments. While not shown, the output bias selection switch SW_OB, the primary matching circuitry 28, and the ancillary matching circuitry 30 may be provided in the LNA circuitry 20 as shown in FIG. 2 without departing from the principles of the present disclosure.

The multi-tap bias selection inductor 36 may provide input impedance matching for each one of the primary amplifier stage 22, the first ancillary amplifier stage 24, and the second ancillary amplifier stage 26. As discussed above, each of these amplifier stages may be associated with a different input capacitance. By providing different inductor sections of the multi-tap bias selection inductor 36 in the signal path of the various amplifier stages, these different input capacitances may be compensated for. For example, the multi-tap bias selection inductor may achieve tuning at the same frequency band for each signal path of the various amplifier stages. Providing this compensation as a multi-tap inductor as shown in FIG. 3 reduces the area dedicated to the inductive elements, as each inductor section is cumulatively added to the signal path as the primary amplifier stage 22, the first ancillary amplifier stage 24, and the second ancillary amplifier stage 26 are provided in the signal path of the LNA circuitry 20, respectively.

While not shown, the primary matching circuitry 28 and the ancillary matching circuitry 30 may also be provided in order to further compensate for dynamic changes in input impedance that may occur in the signal path of the LNA circuitry 20. Further, while FIG. 3 shows the output implemented with direct wired output signal multiplexing, the output bias selection switch SW_OB may also be provided without departing from the principles herein.

Figure 4:
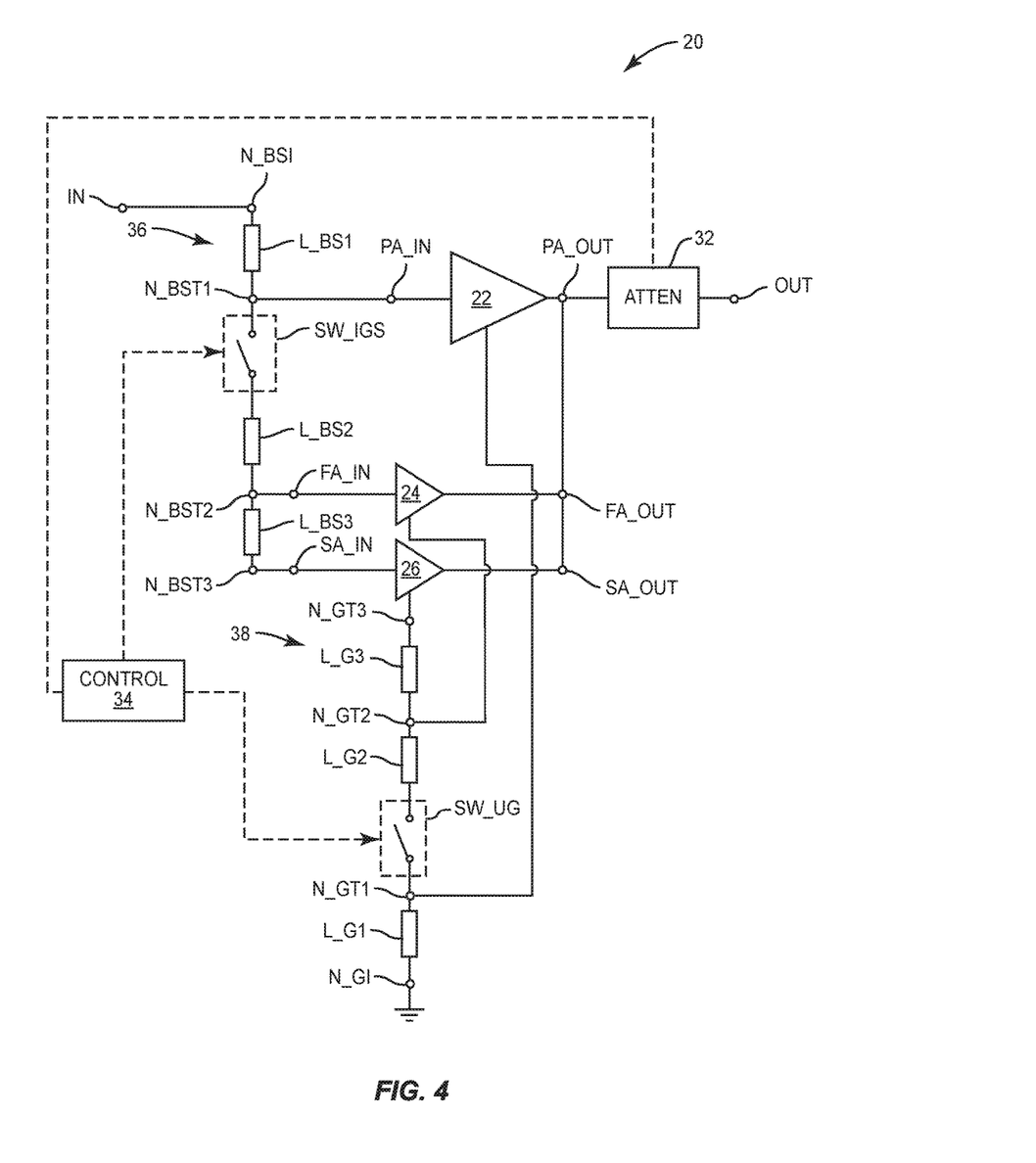
FIG. 4 is a functional schematic illustrating variable gain LNA circuitry according to one embodiment of the present disclosure.

FIG. 4 shows the LNA circuitry 20 according to an additional embodiment of the present disclosure. The LNA circuitry 20 shown in FIG. 3 is substantially similar to that shown in FIG. 4, but further includes a multi-tap grounding inductor 38 including a first grounding inductor section L_G1, a second grounding inductor section L_G2, and a third grounding inductor section L_G3. The first grounding inductor section L_G1 is coupled between a grounding inductor input node N_GI and a first grounding inductor tap node N_GT1. The second grounding inductor section L_G2 is coupled between the first grounding inductor tap node N_GT1 and a second grounding inductor tap node N_GT2. The third grounding inductor section L_G3 is coupled between the second grounding inductor tap node N_GT2 and a third grounding inductor tap node N_GT3. The grounding inductor input node N_GI is coupled to a ground. The second grounding inductor tap node N_GT2 is coupled to the primary amplifier stage grounding node PA_GND. The second grounding inductor tap node N_GT3 is coupled to the first ancillary amplifier stage grounding node FA_GND. The third grounding inductor tap node N_GT3 is coupled to the second ancillary amplifier stage grounding node SA_GND. A unified grounding switch SW_UG may be provided between the first grounding inductor tap node N_GT1 and the second grounding inductor section L_G2, or may be omitted from the LNA circuitry 20.

The multi-tap grounding inductor 38 may serve a similar purpose to the multi-tap bias selection inductor 36, compensating the LNA circuitry 20 for changes in capacitance seen due to selectively providing the primary amplifier stage 22, the first ancillary amplifier stage 24, and the second ancillary amplifier stage 26 in the signal path of the LNA circuitry 20. By providing the multi-tap grounding inductor 38 as shown, the size dedicated to compensation circuitry may be significantly reduced due to the cumulative adding of the inductor sections in the signal paths of the amplifier stages as they are activated and deactivated. The unified grounding switch SW_UG may be open in the first mode, and closed in the second mode and the third mode discussed above in order to provide the first gain response, the second gain response, and the third gain response.

While not shown, the primary matching circuitry 28 and the ancillary matching circuitry 30 may be used along with the LNA circuitry 20 shown in FIG. 4 to compensate for dynamic changes in input impedance that may occur in the signal path of the LNA circuitry 20. Further, the output bias selection switch SW_OB may also be provided without departing from the principles herein. The multi-tap grounding inductor 38 may be used with or without the multi-tap bias selection inductor 36 in various embodiments. While FIGS. 2, 3, and 4 show a single-ended LNA configuration, the concepts presented herein can be easily extended to differential amplifier architectures and even hybrid amplifiers having a single-ended input and a differential output, or a differential input and a single-ended output.

Those skilled in the art will recognize improvements and modifications to the preferred embodiments of the present disclosure. All such improvements and modifications are considered within the scope of the concepts disclosed herein and the claims that follow.

What is claimed is:

1. Low noise amplifier (LNA) circuitry comprising:
   an input node;
   an output node;
   a primary amplifier stage configured to provide a first gain response between a primary amplifier stage input node and a primary amplifier stage output node, wherein the primary amplifier stage input node is coupled to the input node and the primary amplifier stage output node is coupled to the output node;
   a first ancillary amplifier stage configured to provide a second gain response between a first ancillary amplifier stage input node and a first ancillary amplifier stage output node, wherein the first ancillary amplifier stage output node is coupled to the primary amplifier stage output node; and an input gain selection switch coupled between the input node and the first ancillary amplifier stage input node, wherein:
the LNA circuitry is configured to operate in a first mode in which the primary amplifier stage is active, the first ancillary amplifier stage is inactive, and the input gain selection switch is opened such that the first gain response is provided between the input node and the output node; and
the LNA circuitry is configured to operate in a second mode in which the primary amplifier stage is inactive, the first ancillary amplifier stage is active, and the input gain selection switch is closed such that the second gain response is provided between the input node and the output node.

2. The LNA circuitry of claim 1 wherein:
the first gain response is between 14 dB and 20 dB; and
the second gain response is between 6 dB and 12 dB.

3. The LNA circuitry of claim 2 wherein a size of the primary amplifier stage is larger than a size of the first ancillary amplifier stage.

4. The LNA circuitry of claim 1 further comprising:
primary matching circuitry coupled between the input node and the primary amplifier stage input node; and
ancillary matching circuitry coupled between the input gain selection switch and the first ancillary amplifier stage input node, wherein the primary matching circuitry and the ancillary matching circuitry are configured to maintain an impedance presented at the input node at a substantially constant value.

5. The LNA circuitry of claim 1 further comprising an output gain selection switch coupled between the first ancillary amplifier stage output node and the output node, wherein:
in the first mode of the LNA circuitry, the output gain selection switch is opened; and
in the second mode of the LNA circuitry, the output gain selection switch is closed.

6. The LNA circuitry of claim 5 further comprising:
a second ancillary amplifier stage configured to provide a third gain response between a second ancillary amplifier stage input node and a second ancillary amplifier stage output node, wherein:
the second ancillary amplifier stage input node is coupled to the first ancillary amplifier stage input node and the second ancillary amplifier stage output node is coupled to the first ancillary amplifier stage output node;
in the first mode and the second mode of the LNA circuitry, the second ancillary amplifier stage is inactive; and
the LNA circuitry is configured to operate in a third mode in which the primary amplifier stage and the first ancillary amplifier stage are inactive, the second ancillary amplifier stage is active, the input gain selection switch is closed, and the output gain selection switch is closed such that the third gain response is provided between the primary input node and the primary output node.

7. The LNA circuitry of claim 6 wherein:
the first gain response is between 14 dB and 20 dB;
the second gain response is between 6 dB and 12 dB; and
the third gain response is between −3.5 dB and −7.5 dB.

8. The LNA circuitry of claim 6 further comprising:
primary matching circuitry coupled between the input node and the primary amplifier stage input node; and
ancillary matching circuitry coupled between the input gain selection switch and the first ancillary amplifier stage input node, wherein the primary matching circuitry and the ancillary matching circuitry are configured to maintain an impedance presented at the input node at a substantially constant value.

9. The LNA circuitry of claim 1 further comprising:
a second ancillary amplifier stage configured to provide a third gain response between a second ancillary amplifier stage input node and a second ancillary amplifier stage output node, wherein:
the second ancillary amplifier stage input node is coupled to the first ancillary amplifier stage input node and the second ancillary amplifier stage output node is coupled to the first ancillary amplifier stage output node;
in the first mode and the second mode of the LNA circuitry, the second ancillary amplifier stage is inactive; and
the LNA circuitry is configured to operate in a third mode in which the primary amplifier stage and the first ancillary amplifier stage are inactive, the second ancillary amplifier stage is active, the input gain selection switch is closed, and the output gain selection switch is closed such that the third gain response is provided between the primary input node and the primary output node.

10. The LNA circuitry of claim 9 wherein a bias signal provided to one or more of the primary amplifier, the first ancillary amplifier stage, and the second ancillary amplifier stage may be varied to generate different gain responses of the primary amplifier, the first ancillary amplifier stage, and the second ancillary amplifier stage.

11. The LNA circuitry of claim 9 further comprising:
primary matching circuitry coupled between the input node and the primary amplifier stage input node; and
ancillary matching circuitry coupled between the input gain selection switch and the first ancillary amplifier stage input node, wherein the primary matching circuitry and the ancillary matching circuitry are configured to maintain an impedance presented at the input node at a substantially constant value.

12. Low noise amplifier (LNA) circuitry comprising:
an input node;
an output node;
a multi-tap bias selection inductor comprising a first bias selection inductor section coupled between a bias selection inductor input node and a first bias selection inductor tap node and a second bias selection inductor section coupled between the first bias selection inductor tap node and a second bias selection inductor tap node, wherein the bias selection inductor input node is coupled to the input node;
a primary amplifier stage configured to provide a first gain response between a primary amplifier stage input node and a primary amplifier stage output node, wherein the primary amplifier stage input node is coupled to the first bias selection inductor tap node and the primary amplifier stage output node is coupled to the output node; and
a first ancillary amplifier stage configured to provide a second gain response between a first ancillary amplifier stage input node and a first ancillary amplifier stage output node, wherein the first ancillary amplifier stage input node is coupled to the second bias selection inductor tap node and the first ancillary amplifier stage output node is coupled to the primary amplifier stage output node, wherein:
the LNA circuitry is configured to operate in a first mode in which the primary amplifier stage is active and the first ancillary amplifier stage is inactive such that the first gain response is provided between the input node and the output node; and
the LNA circuitry is configured to operate in a second mode in which the primary amplifier stage is inactive and the first ancillary amplifier stage is active such that the second gain response is provided between the input node and the output node.

13. The LNA circuitry of claim 12 further comprising:
primary matching circuitry coupled between the input node and the primary amplifier stage input node; and
ancillary matching circuitry coupled between the input gain selection switch and the first ancillary amplifier stage input node, wherein the primary matching circuitry and the ancillary matching circuitry are configured to maintain an impedance presented at the input node at a substantially constant value.

14. The LNA circuitry of claim 12 further comprising an input gain selection switch coupled between the first bias selection inductor tap node and the second bias selection inductor section, wherein:
in the first mode of the LNA circuitry, the input gain selection switch is opened; and
in the second mode of the LNA circuitry, the input gain selection switch is closed.

15. The LNA circuitry of claim 14 wherein:
the primary amplifier stage is activated by coupling a primary amplifier stage grounding node to ground and deactivated by isolating the primary amplifier stage grounding node from ground;
the first ancillary amplifier stage is activated by coupling a first ancillary amplifier stage grounding node to ground and deactivated by isolating the first ancillary amplifier stage grounding node from ground; and
the LNA circuitry further comprises a multi-tap grounding inductor comprising a first grounding inductor section coupled between a grounding inductor input node and a first grounding inductor tap node and a second grounding inductor section coupled between the first grounding inductor tap node and a second grounding inductor tap node, wherein the grounding inductor input node is coupled to ground, the first grounding inductor tap node is coupled to the primary amplifier stage grounding node, and the second grounding inductor tap node is coupled to the first ancillary amplifier stage grounding node.

16. The LNA circuitry of claim 15 further comprising a grounding switch coupled between the first grounding inductor tap node and the second grounding inductor section, wherein:
in the first mode of the LNA circuitry, the grounding switch is opened; and
in the second mode of the LNA circuitry, the grounding switch is closed.

17. The LNA circuitry of claim 12 wherein:
the primary amplifier stage is activated by coupling a primary amplifier stage grounding node to ground and deactivated by isolating the primary amplifier stage grounding node from ground;
the first ancillary amplifier stage is activated by coupling a first ancillary amplifier stage grounding node to ground and deactivated by isolating the first ancillary amplifier stage grounding node from ground;
the LNA circuitry further comprises a multi-tap grounding inductor comprising a first grounding inductor section coupled between a grounding inductor input node and a first grounding inductor tap node and a second grounding inductor section coupled between the first grounding inductor tap node and a second grounding inductor tap node; and
the grounding inductor input node is coupled to ground, the first grounding inductor tap node is coupled to the primary amplifier stage grounding node, and the second grounding inductor tap node is coupled to the first ancillary amplifier stage grounding node.

18. The LNA circuitry of claim 17 further comprising a grounding switch coupled between the first grounding inductor tap node and the second grounding inductor section, wherein:
in the first mode of the LNA circuitry, the grounding switch is opened; and
in the second mode of the LNA circuitry, the grounding switch is closed.

19. The LNA circuitry of claim 12 wherein:
the multi-tap bias selection inductor further comprises a third bias selection inductor section coupled between the second bias selection inductor tap node and a third bias selection inductor tap node;
the LNA circuitry further comprises a second ancillary amplifier stage configured to provide a third gain response between a second ancillary amplifier stage input node and a second ancillary amplifier stage output node;
the second ancillary amplifier stage input node is coupled to the third bias selection inductor tap node and the second ancillary amplifier stage output node is coupled to the first ancillary amplifier stage output node;
the second ancillary amplifier stage is inactive in the first mode of the LNA circuitry and the second mode of the LNA circuitry; and
in a third mode of the LNA circuitry, the primary amplifier stage and the first ancillary amplifier stage are inactive and the second ancillary amplifier stage is active such that the third gain response is provided between the input node and the output node.

20. The LNA circuitry of claim 19 wherein:
the primary amplifier stage is activated by coupling a primary amplifier stage grounding node to ground and deactivated by isolating the primary amplifier stage grounding node from ground;
the first ancillary amplifier stage is activated by coupling a first ancillary amplifier stage grounding node to ground and deactivated by isolating the first ancillary amplifier stage grounding node from ground;
the third ancillary amplifier stage is activated by coupling a second ancillary amplifier stage grounding node to ground and deactivated by isolating the second ancillary amplifier stage grounding node from ground;
the LNA circuitry further comprises a multi-tap grounding inductor comprising a first grounding inductor section coupled between a grounding inductor input node and a first grounding inductor tap node, a second grounding inductor section coupled between the first grounding inductor tap node and a second grounding inductor tap node, and a third grounding inductor section coupled between the second grounding inductor tap node and a third grounding inductor tap node; and the grounding inductor input node is coupled to ground, the first grounding inductor tap node is coupled to the primary amplifier stage grounding node, the second grounding inductor tap node is coupled to the first ancillary amplifier stage grounding node, and the third grounding inductor tap node is coupled to the second ancillary amplifier stage grounding node.

\* \* \* \* \*